US006882835B2

(12) United States Patent
Oka et al.

(10) Patent No.: US 6,882,835 B2
(45) Date of Patent: Apr. 19, 2005

(54) OSCILLATOR AND COMMUNICATION APPARATUS

(75) Inventors: Manabu Oka, Minowa-machi (JP); Kazushige Ichinose, Minowa-machi (JP)

(73) Assignee: Seiko Epson Corporation (JP)

( * ) Notice: Subject to any disclaimer, the term of this patent is extended or adjusted under 35 U.S.C. 154(b) by 430 days.

(21) Appl. No.: 10/228,157

(22) Filed: Aug. 26, 2002

(65) Prior Publication Data

US 2003/0064694 A1 Apr. 3, 2003

(30) Foreign Application Priority Data

Aug. 29, 2001 (JP) ....................................... 2001-260173

(51) Int. Cl.[7] .................................................. H04B 1/06
(52) U.S. Cl. ....................... 455/260; 455/265; 331/176; 331/177 R
(58) Field of Search .............................. 455/196.1, 255, 455/256, 257, 258, 259, 260, 264, 265, 313, 314, 315, 316; 331/116 R, 158, 176, 175, 177 R

(56) References Cited

U.S. PATENT DOCUMENTS 4,521,119 A 6/1985 Stepke et al.
5,004,988 A * 4/1991 Ueno et al. ............. 331/116 R
5,805,028 A * 9/1998 Kato ...................... 331/116 R
5,883,550 A * 3/1999 Watanabe et al. ........... 331/176
6,362,699 B1 * 3/2002 Fry ............................ 331/176
6,366,175 B1 * 4/2002 Oka ....................... 331/116 R

FOREIGN PATENT DOCUMENTS

| | | |
|---|---|---|
| JP | 48-25463 | 7/1973 |
| JP | 60-82845 | 5/1985 |
| JP | 2001-230630 | 8/2001 |

* cited by examiner

*Primary Examiner*—Nguyen T. Vo
*Assistant Examiner*—Nhan T. Le
(74) *Attorney, Agent, or Firm*—Harness, Dickey & Pierce, P.L.C.

(57) ABSTRACT

An oscillator 10 includes temperature compensation circuits 30 and 40, a frequency adjusting circuit 50, and an initial deviation correcting circuit 60. Switches SW 1 to 4 are controlled based on control data DC stored in a memory 90 so that a temperature compensation voltage V1, a temperature compensation voltage V2, a frequency adjusting voltage V3, and an initial deviation correcting voltage V4, output from the above circuits, are selectively added, supplying a sum to a voltage-controlled oscillation circuit 20 as a control voltage VA.

11 Claims, 16 Drawing Sheets

Sout
OUT
20
25
22
21
24
23
10
VA
70
SW1
SW2
SW3
SW4
V1
V2
V3
V4
Vc
VC
30
40
50
60
80
90
DC
D fc
fa
Lfa
A
B
T1
T0
T2
TEMPERATURE [°C]
6
4
2
0
2
4
6

| COMBINED RESISTANCE RS1 | 100k | 200k | • • • | 900k(Ω) |
|---|---|---|---|---|
| COMBINED RESISTANCE RS2 | 900k | 800k | • • • | 100k(Ω) |
| INPUT RESISTANCE OF VC TERMINAL | 1M | 1M | • • • | 1M(Ω) |
| VOLTAGE V3 | 0.9VC | 0.8VC | • • • | 0.1VC |

| MODE \ SWITCH | SW1 | SW2 | SW3 | SW4 | APPLICATION |
|---|---|---|---|---|---|
| VC-TCXO | ON | ON | ON | ON | CELLULAR PHONE |
| TCXO | ON | ON | OFF | ON | PHS,GPS |
| VCXO | OFF | ON/OFF | ON | ON | FOR LOW NOISE |
| SPXO | OFF | OFF | OFF | ON | FOR LOW NOISE |
| TEST MODE | OFF | OFF | OFF | OFF | |

OUT
Sout
BUFFER CIRCUIT
25
20
OSCILLATION CIRCUIT
22
21
24
23
10
VA
SW3
V3
50
FREQUENCY ADJUSTING CIRCUIT
Vc
VC
70
V4
INITIAL DEVIATION CORRECTING CIRCUIT
60
80
CONTROL CIRCUIT
90
MEMORY
DC
SW1
V1
V2
30
TEMPERATURE COMPENSATION CIRCUIT
40
TEMPERATURE COMPENSATION CIRCUIT
D OUT
Sout
20
BUFFER CIRCUIT
25
OSCILLATION CIRCUIT
22
21
24
23
10
VA
SW3
V3
50
FREQUENCY ADJUSTING CIRCUIT
Vc
VC
V4
INITIAL DEVIATION CORRECTING CIRCUIT
60
70
80
CONTROL CIRCUIT
90
MEMORY
DC
V1
V2
30
TEMPERATURE COMPENSATION CIRCUIT
40
TEMPERATURE COMPENSATION CIRCUIT
D

OSCILLATOR AND COMMUNICATION APPARATUS

TECHNICAL FIELD

The present invention relates to oscillators used in communication apparatuses such as cellular phones, and communication apparatuses incorporating the oscillators. More specifically, it relates to an oscillator that allows changing functions and a communication apparatus incorporating the oscillator.

BACKGROUND ART

In general, crystal oscillators are classified, by their functions, as SPXOs (Simple Packaged Crystal Oscillators), VCXO (Voltage Controlled Crystal Oscillators), TCXO (Temperature Compensated Crystal Oscillators), etc. An SPXO is a crystal oscillator that does not perform temperature compensation. A TCXO (temperature-compensated oscillator) is a crystal oscillator that performs temperature compensation so as not to change output frequency even if ambient temperature changes. A VCXO (voltage-controlled oscillator) is a crystal oscillator that changes output frequency in accordance with a control voltage that is supplied externally. A crystal oscillator with the function of VCXO added to TCXO is called a VC-TCXO. A VC-TCXO is used, for example, in a cellular phone in order to implement AFC (Approximately Frequency Control) function for the cellular phone to adjust frequency more accurately with reference to a signal from a base station.

Hitherto, manufacturers of oscillators have been developing these oscillators independently of each other in accordance with the market and customer needs in order to manufacture and supply oscillators that satisfy the customer needs.

However, since TCXOs, VCXOs, etc. have generally been developed independently of each other, and even common parts have been developed independently, efficiency of development has been inadequate. Furthermore, due to the independent development, separate production lines and separate inventory management of parts have been needed in spite of many parts being common.

In recent years, with the progress of information-oriented society, out of the need for improved processing ability and faster communication speed of electronic apparatuses, demand has been raised for a wider operating temperature range and reduction in phase noise of the oscillators.

DISCLOSURE OF INVENTION

It is an object of the present invention to provide an oscillator that allows setting of required functions and changing functions and a communication apparatus incorporating the oscillator, serving to improve efficiency of development and to facilitate inventory management.

In order to achieve the above object, the present invention provides an oscillator comprising a voltage-controlled oscillation circuit including a vibrator, frequency of an output signal thereof changing in accordance with a control voltage supplied thereto; a first temperature compensation circuit for outputting a first temperature compensation voltage for temperature-compensating a frequency-temperature characteristic of the vibrator according to a cubic curve model that approximates a frequency-temperature characteristic of the vibrator; a second temperature compensation circuit for outputting a second temperature compensation voltage for temperature-compensating a frequency-temperature characteristic of the vibrator according to a linear line model that approximates a frequency-temperature characteristic of the vibrator; and selection means for supplying either a sum voltage of the first temperature compensation voltage and the second temperature compensation voltage or the second temperature compensation voltage to the voltage-controlled oscillation circuit as the control voltage.

According to the construction of the oscillator, the frequency of the output signal of the voltage-controlled oscillation circuit is controlled based on the second temperature compensation voltage, so that a frequency-temperature characteristic of the output signal can be temperature-compensated to achieve a frequency-temperature characteristic that is rotated as compared with that of the vibrator itself. Furthermore, the frequency of the output signal of the voltage controlled oscillation circuit is controlled based on a sum voltage of the first temperature compensation voltage and the second temperature compensation voltage, so that a frequency-temperature characteristic of the output signal can be temperature-compensated so as to achieve a characteristic within an intended range of frequency deviation over an even wider temperature range. Thus, the selection means supplies either a sum of the first the first temperature compensation voltage and the second temperature compensation voltage or the second temperature compensation voltage to the voltage-controlled oscillation circuit as the control voltage, so that a frequency-temperature characteristic of the output signal can be adjusted in accordance with an intended use of the oscillator.

Furthermore, the present invention provides an oscillator wherein the selection means comprises a switch for selecting whether or not to output the first temperature compensation voltage; an addition circuit for adding the first temperature compensation voltage supplied via the switch and the second temperature compensation voltage, outputting a sum as the control voltage; a memory for storing control data for controlling the switch; and a control circuit for storing the control data in the memory based on adjustment control data that is supplied externally and controlling the switch based on the control data stored in the memory.

According to the construction of the oscillator, the control circuit controls the switch based on the control data stored in the memory, changing the control voltage output from the addition circuit, so that whether or not to keep a frequency-temperature characteristic of the output signal within an intended range of frequency deviation can be readily selected over a wide temperature range. Furthermore, the control circuit stores control data in the memory based on adjustment control data that is externally supplied, so that a frequency temperature characteristic of the oscillator can be set anytime after manufacturing of the oscillator.

Furthermore, the present invention provides an oscillator wherein the selection means comprises a memory for storing control data; an addition circuit for adding the first temperature compensation voltage and the second temperature compensation voltage, outputting a sum as the control voltage; and a control circuit for storing the control data in the memory based on adjustment control data that is supplied externally and controlling operation of the second temperature compensation circuit based on the control data stored in the memory.

According to the construction of the oscillator, the control circuit controls operation of the second temperature compensation circuit based on the control data stored in the memory, thereby changing the control voltage output from the addition circuit, so that whether or not to keep a frequency-temperature characteristic of the output signal within an intended range of frequency deviation can be readily selected over a wide temperature range. Furthermore, the control circuit stores control data in the memory based on adjustment control data that is externally supplied, so that a frequency-temperature characteristic of the oscillator can be set anytime after manufacturing of the oscillator.

Furthermore, in order to achieve the above object, the present invention provides an oscillator comprising a voltage-controlled oscillation circuit including a vibrator, frequency of an output signal thereof changing in accordance with a control voltage supplied thereto; a first temperature compensation circuit for outputting a first temperature compensation voltage for temperature-compensating a frequency-temperature characteristic of the vibrator according to a cubic curve model that approximates a frequency-temperature characteristic of the vibrator; a second temperature compensation circuit for outputting a second temperature compensation voltage for temperature-compensating a frequency-temperature characteristic of the vibrator according to a linear line model that approximates a frequency-temperature characteristic of the vibrator; and selection means for supplying one of a sum voltage of the first temperature compensation voltage and the second temperature compensation voltage, the first temperature compensation voltage, and the second temperature compensation voltage to the voltage-controlled oscillation circuit as the control voltage.

According to the construction of the oscillator, the selection means outputs one of a sum voltage of the first temperature compensation voltage and the second temperature compensation voltage, the first temperature compensation voltage, and the second temperature compensation voltage to the voltage-controlled oscillation circuit as the control voltage, so that a frequency-temperature characteristic of the output signal can be adjusted in accordance with an intended use of the oscillator.

Furthermore, the present invention provides an oscillator wherein the selection means comprises a first switch for selecting whether or not to output the first temperature compensation voltage; a second switch for selecting whether or not to output the second temperature compensation voltage; an addition circuit for adding the first temperature compensation voltage supplied via the first switch and the second temperature compensation voltage supplied via the second switch, outputting a sum as the control voltage; a memory for storing control data for controlling the first and second switches; and a control circuit for storing the control data in the memory based on adjustment control data that is supplied externally and controlling the first and second switches based on the control data stored in the memory.

According to the construction of the oscillator, the control circuit controls the first and second switches based on the control data stored in the memory, changing the control voltage output from the addition circuit, so that whether or not to keep a frequency-temperature characteristic of the output signal within an intended range of frequency deviation can be readily selected over a wide temperature range. Furthermore, the control circuit stores control data in the memory based on adjustment control data that is externally supplied, so that a frequency-temperature characteristic of the oscillator can be set anytime after manufacturing of the oscillator.

Furthermore, the present invention provides an oscillator wherein the selection means comprises a memory for storing control data; an addition circuit for adding the first temperature compensation voltage and the second temperature compensation voltage, outputting a sum as the control voltage; and a control circuit for storing the control data in the memory based on adjustment control data that is supplied externally and controlling operation of the first and second temperature compensation circuits based on the control data stored in the memory.

According to the construction of the oscillator, the control circuit controls operation of the first and second temperature compensation circuits based on the control data stored in the memory, thereby changing the control voltage output from the addition circuit, so that whether or not to keep a frequency-temperature characteristic of the output signal within an intended range of frequency deviation can be readily selected over a wide temperature range. Furthermore, the control circuit stores control data in the memory based on adjustment control data that is externally supplied, so that a frequency-temperature characteristic of the oscillator can be set anytime after manufacturing of the oscillator.

Furthermore, the present invention provides an oscillator according to one of the modes described above, wherein the first temperature compensation circuit outputs the first temperature compensation voltage only in a preset temperature range, and the temperature range excludes at least a temperature range in which the second temperature compensation voltage suffices to keep frequency deviation of the output signal within a predetermined range of frequency deviation.

According to the construction of the oscillator, the first temperature compensation circuit outputs the first temperature compensation voltage in a temperature range in which the second temperature compensation voltage does not suffice to keep frequency deviation of the output signal within the predetermined range of frequency deviation, so that power consumption of the first temperature compensation circuit is reduced.

Furthermore, the present invention provides an oscillator further comprising a frequency adjusting circuit for converting a control voltage that is supplied externally to output a frequency adjusting voltage, wherein the selection means further comprises a third switch for selecting whether or not to output the frequency adjusting voltage, the control circuit further controls the third switch based on the control data stored in the memory, and the addition circuit further adds the frequency adjusting voltage supplied via the third switch, outputting a sum as the control voltage.

According to the construction of the oscillator, a frequency adjusting voltage obtained by converting a control voltage that is supplied externally is allowed to be included in the control voltage output from the addition circuit, so that the frequency of the output signal is allowed to be externally controlled. Furthermore, the control circuit selects whether or not to include the frequency adjusting voltage in the control voltage based on the control data stored in the memory, so that whether or not to externally control the frequency of the output signal is allowed to be set when the control data is stored.

Furthermore, the present invention provides an oscillator further comprising an initial deviation correcting circuit for outputting an initial deviation correcting voltage for correcting an initial deviation of the frequency of the output signal, wherein the selection means further comprises a fourth switch for selecting whether or not to output the initial deviation correcting voltage, the control circuit further controls the fourth switch based on the control data stored in the memory, and the addition circuit further adds the initial deviation correcting voltage supplied via the fourth switch, outputting a sum as the control voltage.

According to the construction of the oscillator, an initial deviation correcting voltage for correcting an initial deviation of the frequency of the output signal is allowed to be included in the control voltage output from the addition circuit, so that correction of the initial deviation is allowed. Furthermore, the control circuit selects whether or not to include the initial deviation correcting voltage in the control voltage based on the control data stored in the memory, so that evaluation of the vibrator itself in a mounted state is allowed in a setting in which the initial deviation is not corrected.

Furthermore, the present invention provides an oscillator further comprising a first filter for removing noise in the first temperature compensation voltage, provided subsequently to the first temperature compensation circuit; and a second filter for removing noise in the second temperature compensation voltage, provided subsequently to the second temperature compensation circuit.

According to the construction of the oscillator, the first and second filters remove noise included in the first and second temperature compensation voltages, so that a frequency-temperature characteristic of the oscillator is temperature-compensated accurately.

Furthermore, the present invention provides a communication apparatus incorporating an oscillator according to one of the modes described above, the communication apparatus operating based on the output signal of the oscillator.

Since the oscillator allows adjustment of a frequency-temperature characteristic of the output signal in accordance with an intended use thereof as described above, high accuracy of temperature compensation, frequency adjusting function, and reduction in power consumption, which are required for a communication apparatus, can be achieved.

BEST MODE FOR CARRYING OUT THE INVENTION

Preferred embodiments of the present invention will now be described with reference to the drawings. The present invention is not limited to the embodiments, and various modifications are possible within the spirit thereof.

[1] First Embodiment

[1-1] Overall Construction of the First Embodiment

Figure 1:
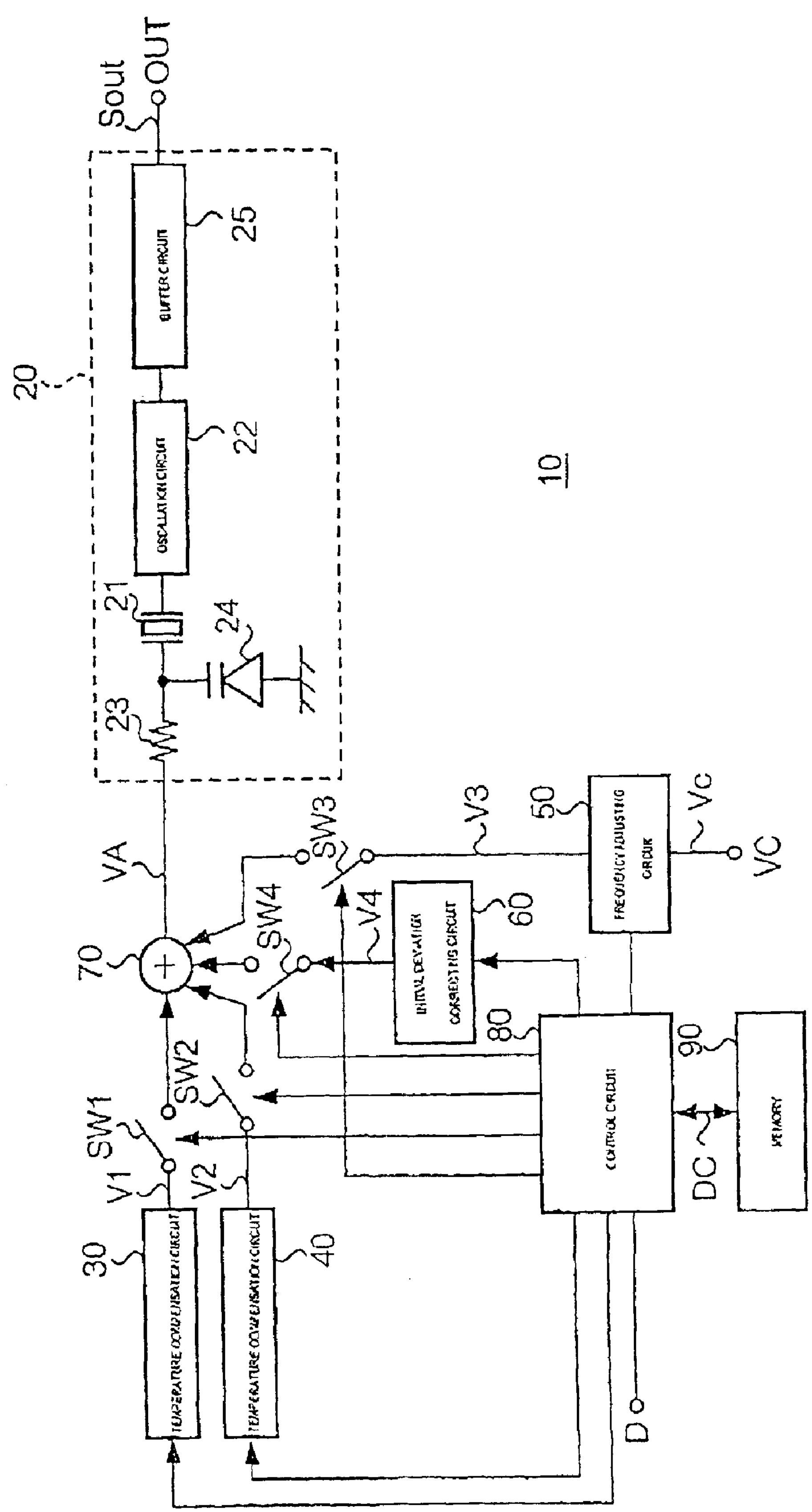
FIG. 1 is a principle construction diagram of an oscillator according to a first embodiment of the present invention.

FIG. 1 is a principle construction diagram of an oscillator according to a first embodiment of the present invention.

The oscillator 10 includes a voltage-controlled oscillation circuit 20, temperature compensation circuits 30 and 40, a frequency adjusting circuit 50, an initial deviation correcting circuit 60, an addition circuit 70, a control circuit 80, a memory 90, and switches SW1, SW2, SW3, and SW4.

The voltage-controlled oscillation circuit 20 includes an oscillation circuit 22 for causing oscillation of a piezoelectric vibrator 21 such as a crystal vibrator or a ceramic vibrator; a variable-capacitance diode (hereinafter referred to as a varicap) 24 connected to a midpoint node between an input resistor 23 and the piezoelectric vibrator 21; and a buffer circuit 25. The frequency of an oscillation signal Sout output from an output terminal OUT changes in accordance with the capacitance of the varicap 24 changing in accordance with a control voltage VA applied via the input resistor 23.

Figure 2:
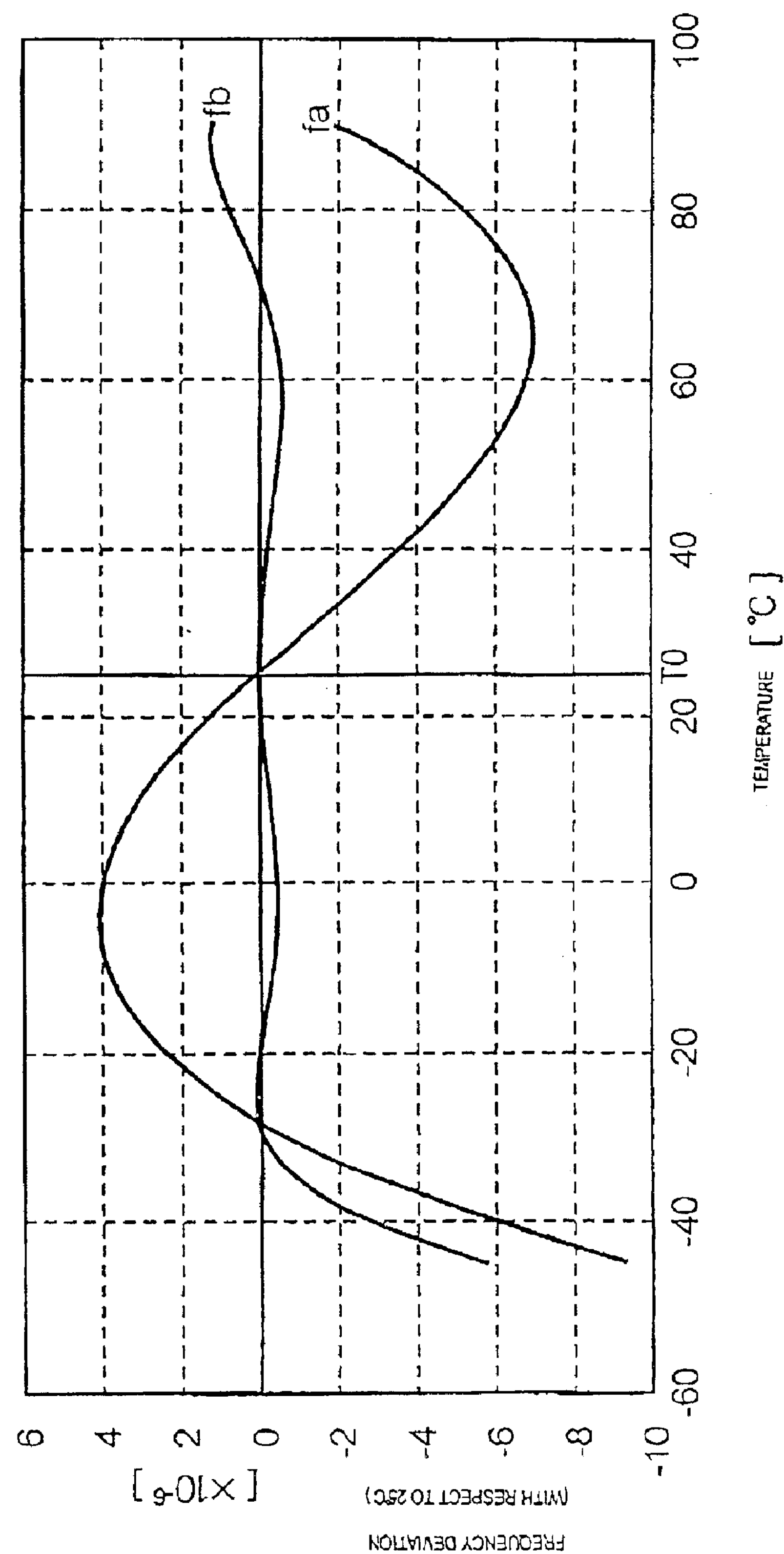
FIG. 2 is a characteristic curve diagram showing a frequency-temperature characteristic fa of a piezoelectric vibrator and a frequency-temperature characteristic fb that has been temperature-compensated.

The temperature compensation circuit 30 is a circuit for outputting a temperature compensation voltage V1 for temperature-compensating a frequency-temperature characteristic of the piezoelectric vibrator 21 according to a cubic curve model that approximates a frequency-temperature characteristic of the piezoelectric vibrator 21. Use of the temperature compensation circuit 30 serves to keep frequency deviation of the oscillation signal Sout within an intended range of frequency deviation over a wide temperature range. For example, if the piezoelectric vibrator 21 is of a type whose frequency-temperature characteristic is approximated substantially by a cubic curve, such as an AT-cut vibrator, a frequency-temperature characteristic fa of the piezoelectric vibrator 21 itself can be temperature-compensated to achieve a frequency-temperature characteristic fb with a smaller frequency deviation over a wide temperature range centered at a reference temperature (a temperature T0 (e.g., 25° C.) at a frequency f0 for calculating frequency deviation f/f0), as shown in FIG. 2.

Figure 3:
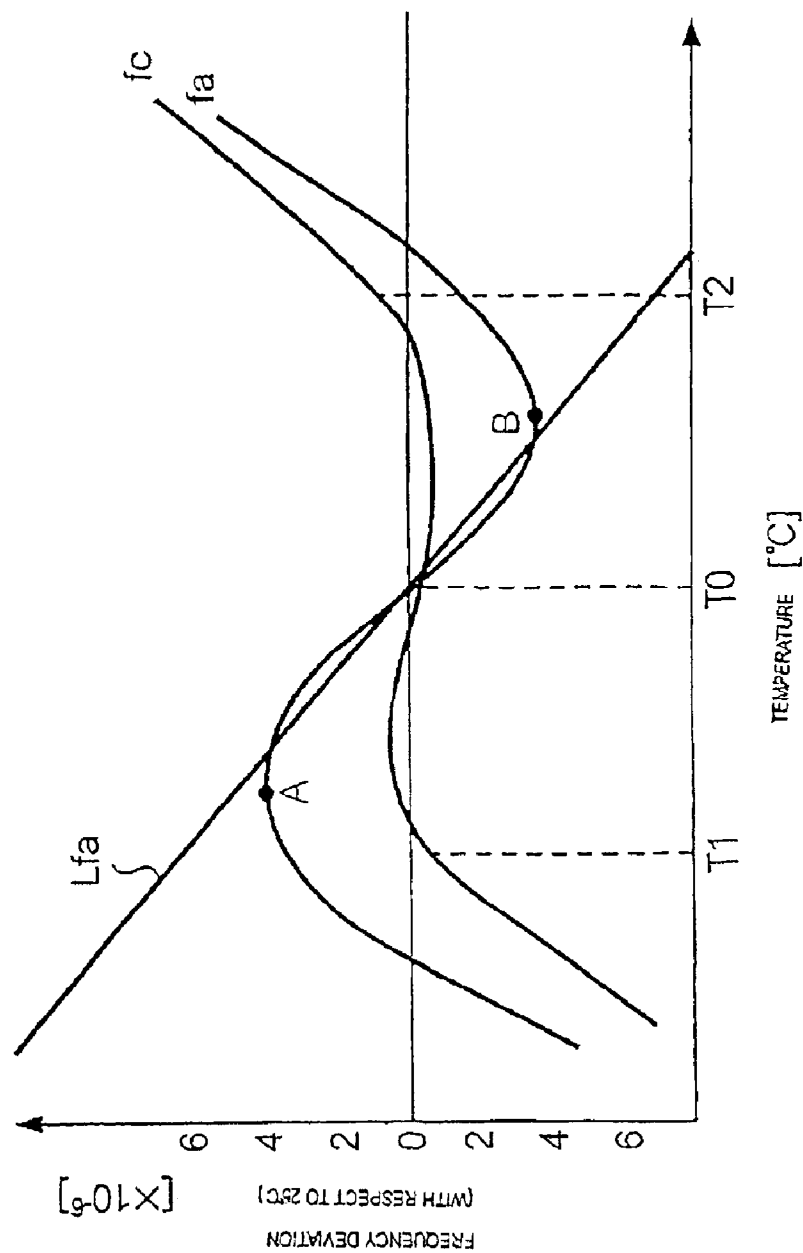
FIG. 3 is a characteristic curve diagram for explaining temperature-compensating the frequency-temperature characteristic fa of the piezoelectric vibrator to achieve the frequency-temperature characteristic fc.

The temperature compensation circuit 40 is a circuit for outputting a temperature compensation voltage V2 for temperature-compensating a frequency-temperature characteristic of the piezoelectric vibrator 21 according to a linear line model that approximates a frequency-temperature characteristic of the piezoelectric vibrator 21. That is, if the piezoelectric vibrator 21 is of a type whose frequency-temperature characteristic fa is approximated substantially by a cubic curve, such as an AT-cut vibrator, the temperature compensation circuit outputs a temperature compensation voltage Vc2 for temperature-compensating a frequency-temperature characteristic Lfa that is approximated by a linear line substantially between inflection points A and B of the frequency-temperature characteristic fa, as shown in FIG. 3. Thus, use of the temperature compensation circuit 40 allows temperature compensation such that the frequency-temperature characteristic fa of the piezoelectric vibrator 21 itself is rotated about the reference temperature T0 to achieve a frequency-temperature characteristic fc, as shown in FIG. 3. Accordingly, temperature compensation is allowed such that frequency deviation is within an intended range over a range from a temperature T1 to a temperature T2, centered at the reference temperature T0.

Thus, flexible operation in accordance with intended use is allowed, such that one or both of the temperature compensation voltages V1 and V2 output from the temperature compensation circuits 30 and 40 is selected in accordance with a required frequency-temperature characteristic.

The frequency adjusting circuit 50 is a circuit for outputting a frequency adjusting voltage V3 for changing the frequency of the oscillation signal Sout according to a control voltage Vc from outside that is applied to a frequency adjusting terminal VC.

The initial deviation correcting circuit 60 is a circuit for outputting an initial deviation correcting voltage V4. The initial deviation correcting voltage V4 is used for correcting initial frequency fluctuation of the oscillation signal Sout output from the oscillator 10, caused by fluctuation in the frequency of the piezoelectric vibrator 21.

In the oscillator 10, the temperature compensation circuits 30 and 40, the frequency adjusting circuit 50, and the initial deviation correcting circuit 60 are connected to the addition circuit 70 via the switches SW1, SW2, SW3, and SW4, respectively. The addition circuit 70 adds the temperature compensation voltage V1, the temperature compensation voltage V2, the frequency adjusting voltage V3, and the initial deviation correcting voltage V4 selected via the switches SW1 to SW4, and outputs a sum output voltage to the voltage-controlled oscillation circuit 20 as the control voltage VA.

The control circuit 80 controls the entire oscillator 10 based on control data DC stored in the memory 90. More specifically, the control circuit 80 controls ON/OFF of the switches SW1 to SW4, ON/OFF of switches constituting the frequency adjusting circuit 50, which will be described later, and ON/OFF of switches constituting the initial deviation correcting circuit 60, which will be described later. Furthermore, the control circuit 80 stores control data DC input from data input terminals D in the memory 90, and stores temperature compensation data input from the data input terminals D in temperature compensation data memories of the temperature compensation circuits 30 and 40, which will be described later. Although only a single data input terminal D is shown in FIG. 1 for simplicity of illustration, actually, a plurality of data input terminals D is provided.

[1-2] Construction of the Oscillation Circuit

Figure 4:
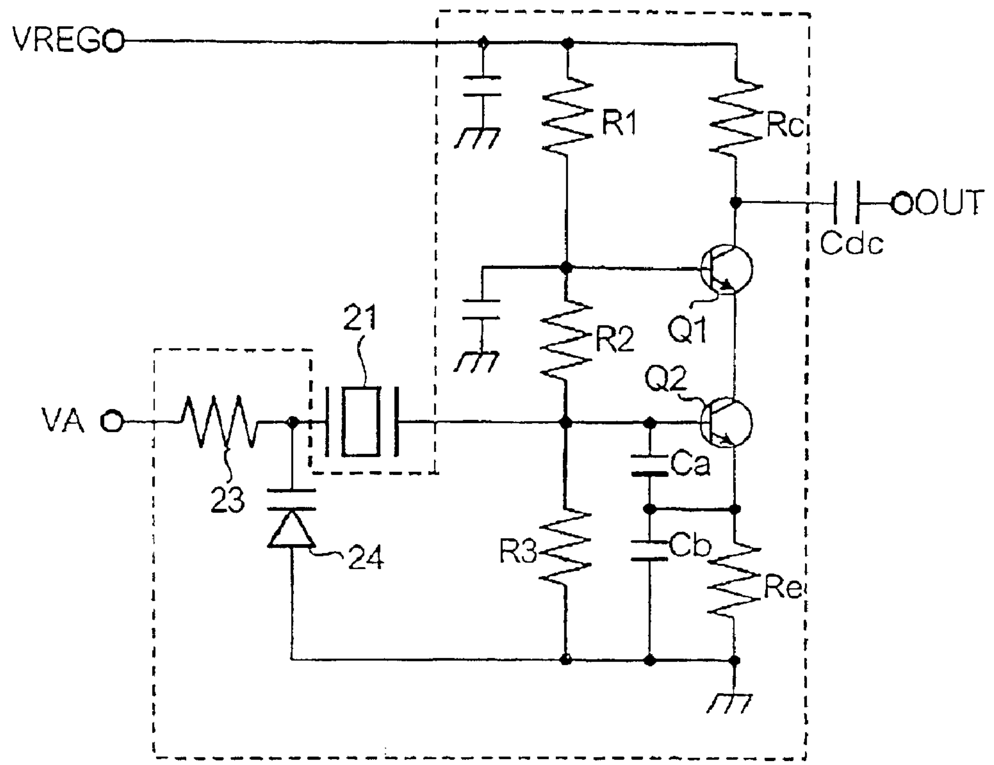
FIG. 4 is a circuit diagram of an oscillation circuit.

FIG. 4 is a circuit diagram of the oscillation circuit 22. The oscillation circuit 22 includes a first bias resistor R1 and a second bias resistor R2 connected in series between a constant voltage power supply VREG and the piezoelectric vibrator 21; a third bias resistor R3, one end thereof being connected to a midpoint node between the piezoelectric vibrator 21 and the first bias resistor R1 and the other end thereof being grounded; an NPN transistor Q1, the base thereof being connected to a midpoint node between the first bias resistor R1 and the second bias resistor R2; an NPN transistor Q2, the base thereof being connected to a midpoint node between the piezoelectric vibrator 21 and the second bias resistor R2 and the collector thereof being connected to the emitter of the NPN transistor Q1; and a collector resistor Rc, one end thereof being connected to the constant voltage power supply VREG and the other end thereof being connected to the collector of the NPN transistor Q1.

The constant voltage power supply VREG is a voltage generated by a voltage regulator circuit (not shown) from a high-potential power supply supplied to the oscillator 10, and the voltage is stable against variation in the high-potential power supply and change in ambient temperature.

Furthermore, the oscillation circuit 22 includes a DC cutting capacitor Cdc for removing DC component of the oscillation frequency Sout, one end thereof being connected to a midpoint node between the collector resistor Rc and the NPN transistor Q1 and the other end thereof being connected to the output terminal OUT; an emitter resistor Re, one end thereof being connected to the emitter of the NPN transistor Q2 and the other end thereof being grounded; a first oscillation capacitor Ca, one end thereof being connected to a midpoint node between the base of the NPN transistor Q2 and the piezoelectric vibrator 21 and the other end thereof being connected to a midpoint node between the emitter of the NPN transistor Q2 and the emitter resistor Re; and a second oscillation capacitor Cb, one end thereof being connected to a midpoint node between the emitter of the NPN transistor Q2 and the emitter resistor Re and the other end thereof being grounded. In FIG. 4, a region surrounded by a wavy line indicates a portion to be included when components including the oscillation circuit 22 are implemented by a one-chip IC. The voltage regulator circuit may further be incorporated in the IC.

[1-3] Constructions of the Temperature Compensation Circuits

Figure 5:
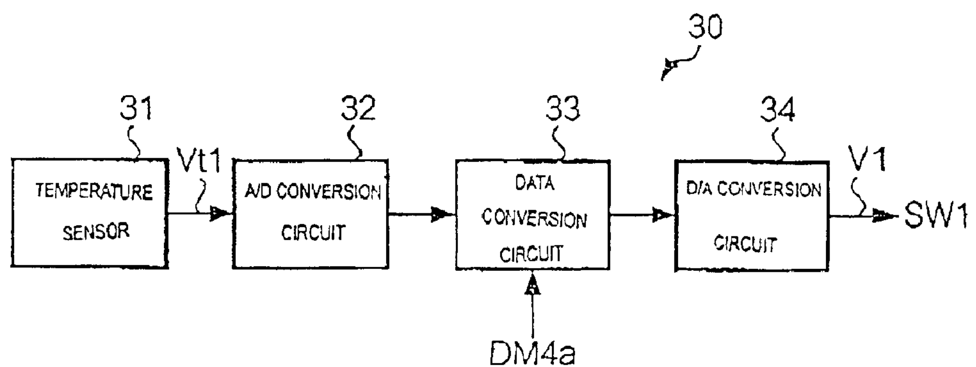
FIG. 5 is a block diagram of a temperature compensation circuit.

FIG. 5 is a block diagram of the temperature compensation circuit 30. The temperature compensation circuit 30 includes a temperature sensor 31, an analog/digital (A/D) conversion circuit 32, a data conversion circuit 33, and a digital/analog (D/A) conversion circuit 34. In the temperature compensation circuit 30, a temperature-dependent voltage Vt1 output from the temperature sensor 31 undergoes analog/digital conversion in the A/D conversion circuit 32. Then, data conversion takes place in the data conversion circuit 33 based on data (temperature compensation data) Dm4*a* for the temperature compensation circuit 30, stored in the memory 90. Furthermore, digital/analog conversion takes place in the D/A conversion circuit 34, whereby a temperature compensation voltage VI is output. Thus, with regard to the temperature compensation circuit 30, the data DM4*a* for the temperature compensation circuit 30 is prepared in advance so that a frequency-temperature characteristic of the piezoelectric vibrator 21 will be temperature-compensated according to a cubic curve model that approximates a frequency-temperature characteristic of the piezoelectric vibrator 21. Accordingly, a temperature compensation voltage V1 that allows temperature compensation of a frequency-temperature characteristic, represented by a cubic curve, of the piezoelectric vibrator 21 is output.

Figure 6:
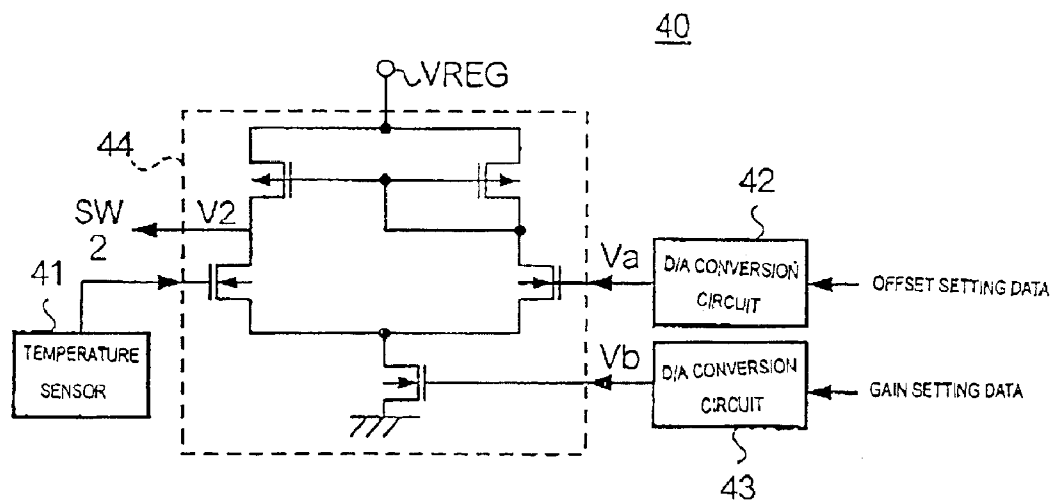
FIG. 6 is a block diagram of another temperature compensation circuit.

FIG. 6 is a block diagram of the temperature compensation circuit 40. The temperature compensation circuit 40 includes a temperature sensor 41, two digital/analog (D/A) conversion circuits 42 and 43, and a variable-gain amplifier 44.

The D/A conversion circuits 42 and 43 executes digital/analog conversion of offset setting data and gain setting data included in data (temperature compensation data) DM4*b* for the temperature compensation circuit 40, stored in the memory 90, outputting an offset voltage Va and a gain setting voltage Vb to the variable-gain amplifier 44.

Figure 7:
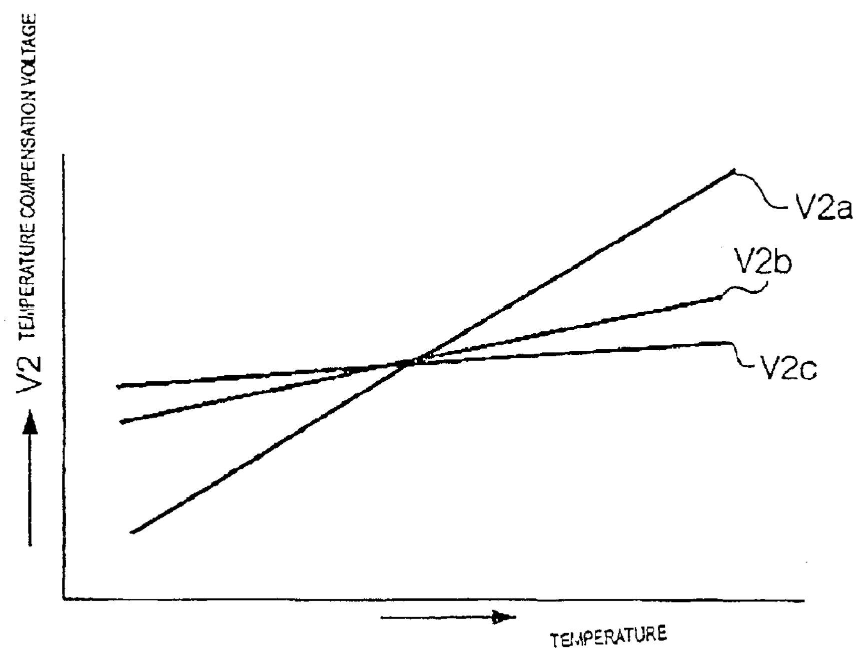
FIG. 7 is a diagram showing relationship between temperature of a temperature compensation circuit and a temperature compensation voltage V2.

The variable-gain amplifier 44 is a differential amplifier driven by a power supply voltage applied to the constant voltage power supply VREG, and it modifies a gain, which is the gradient of a temperature-dependent voltage Vs2 output from the temperature sensor, in accordance with the gain setting voltage Vb. Furthermore, the variable-gain amplifier 44 executes correction based on the difference between the temperature-dependent voltage Vs and the offset voltage Va so that the potential at the reference temperature (e.g., 25° C.) will be a predetermined potential, thereby outputting a temperature compensation voltage V2. FIG. 7 is a diagram showing relationship between the temperature of the temperature compensation circuit 40 and the temperature compensation voltage V2, in which control characteristics of three types V2*a*, V2*b*, and V2*c* are shown as examples. As described above, it suffices for the temperature compensation circuit 40 to have a control characteristic of a linear function, so that a control characteristic can be modified by modifying the temperature compensation data so as to change gradient and/or intercept.

[1-4] Construction of the Frequency Adjusting Circuit

Figures 8, 9:
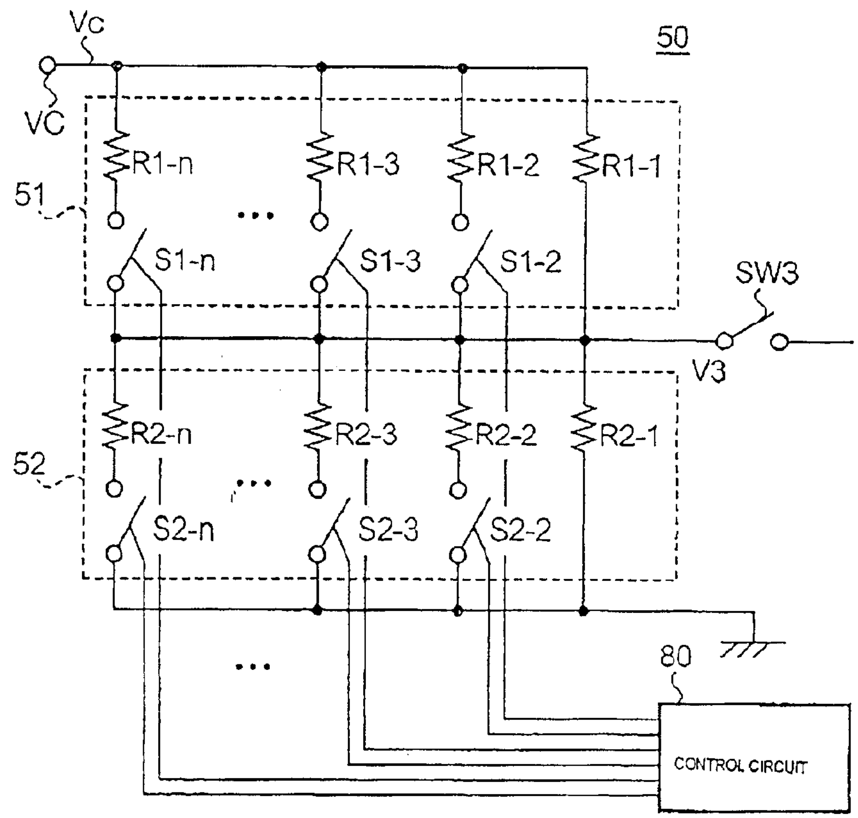
FIG. 8 is a circuit diagram showing a frequency adjusting circuit together with a control circuit.
FIG. 9 is a diagram for explaining a case where change in input resistance (input impedance) of the frequency adjusting circuit is maintained constant.

FIG. 8 is a circuit diagram showing the frequency adjusting circuit 50 together with the control circuit 80. The frequency adjusting circuit 50 includes a first resistor circuit 51, one end thereof being connected to the frequency adjusting terminal VC and the other end thereof being connected to the switch SW3; and a second resistor circuit 52, one end thereof being connected to a midpoint node between the first resistor circuit 51 and the switch SW3 and the other end thereof being grounded. The first resistor circuit 51 includes a first base resistor R1-1, one end thereof being connected to the frequency adjusting terminal VC and the other end thereof being connected to the switch SW3; (n−1) resistors R1-k (k=2 to n) that function as resistors to be selected for changing the resistance of the first resistor circuit 51; and switches S1-k for connecting selected ones of the resistors R1-1 to R1-n with the first base resistor R1-1 in parallel. In this case, the resistances of the resistors R1-1 to R1-n may be all the same or different from one another.

The second resistor circuit 52 includes a second base resistor R2-1, one end thereof being connected to a midpoint node between the first resistor circuit 51 and the switch SW3 and the other end thereof being grounded; (n−1) resistors R2-k (k=2 to n) that function as resistors to be selected for changing the resistance of the second resistor circuit 52; and switches S2-k for connecting selected ones of the resistors R2-1 to R2-n with the second base resistor R2-1 in parallel. In this case, the resistances of the resistors R2-1 to R2-n may be all the same or different from one another. When the resistances are to be varied, setting of resistance over a wide range is allowed by setting the resistances of the resistors R2-1 to R2-n to be $2^X$ (X is an integer not smaller than 2) times a preset resistance of the second base resistor R2-1.

In this case, letting the combined resistance of the first resistor circuit 51 be denoted as RS1 and the combined resistance of the second resistor circuit 52 as RS2, a frequency adjusting voltage V3 that is generated when a control voltage Vc is supplied to the frequency adjusting terminal VC can be expressed by the following equation:

$$V3=RS2/(RS1+RS2)\cdot Vc$$

That is, by combining the combined resistance RS1 of the first resistor circuit 51 and the combined resistance RS2 of the second resistor circuit 52, change in input resistance (input impedance) of the frequency adjusting terminal VC, associated with adjustment of frequency, can be maintained substantially constant, as shown in FIG. 9, serving to facilitate design of circuitry on the upstream of the frequency adjusting terminal VC. In addition, the frequency adjusting circuit 50 allows the frequency control characteristic to be changed without use of active elements, which is advantageous in that phase noise in the output signal Sout will not be increased.

[1-5] Construction of the Initial Deviation Correcting Circuit

Figure 10:
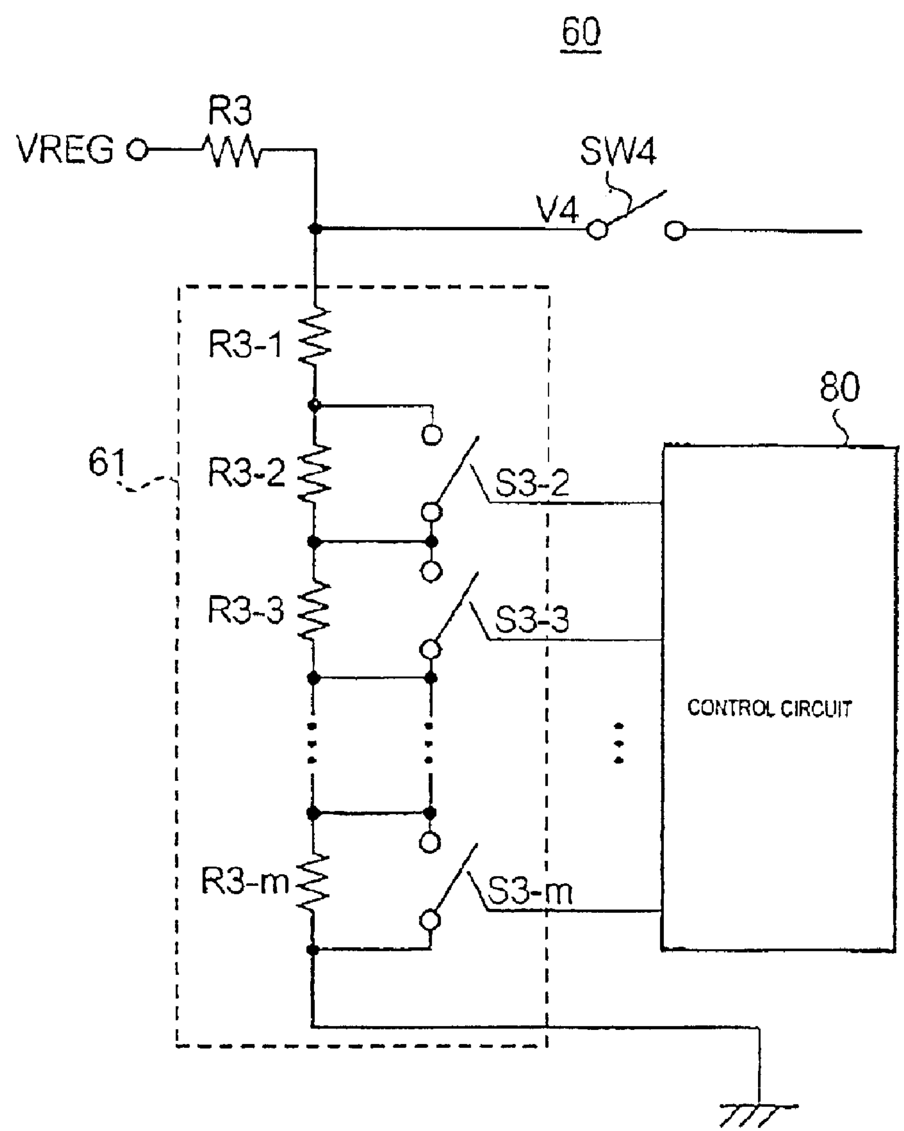
FIG. 10 is a circuit diagram showing an initial deviation correcting circuit together with the control circuit.

FIG. 10 is a circuit diagram showing the initial deviation correcting circuit 60 together with the control circuit 80.

The initial deviation correcting circuit 60 includes a base resistor R3-1, one end thereof being connected to the constant voltage power supply VREG and the other end thereof being connected to the switch SW4 via a resistor R3; (m−1) resistors R3-i (i=2 to m) that function as resistors to be selected for changing the resistance of the initial deviation correcting circuit 60; and switches S3-i for connecting selected ones of the resistors R3-i to R3-m with the base resistor R3-1 in parallel.

In the initial deviation correcting circuit 60, resistance is set by controlling the switches in accordance with initial fluctuation of the oscillator 10. Letting the combined resistance of a third resistor circuit 61 constituted of the switches S3-2 to S3-m as RS3, an initial deviation correcting voltage V4 can be expressed by the following equation:

$$V4=R3/RS3\cdot VREG$$

That is, the switches S3-2 to S3-m of the third resistor circuit 61 are controlled by the control circuit 80, so that the initial deviation correcting circuit 60 coverts the voltage level of the power supply voltage applied to the constant voltage power supply VREG to output an initial deviation correcting voltage V4. Accordingly, deviation in the frequency of the output signal Sout, caused by fluctuation of the piezoelectric vibrator 21, etc., is corrected.

[1-6] Specific Construction of the Switches

When the oscillator 10 is implemented by an IC, the switches SW1 to SW4, the switches S1-1 to S1-n, the switches S2-1 to S2-n, and the switches S3-2 to S3-m are constructed, depending on a semiconductor manufacturing process employed, for example, as follows:

i. When bipolar process is employed in semiconductor manufacturing process, the switches are implemented by bipolar transistors.

ii. When CMOS process is employed in semiconductor manufacturing process, the switches are implemented by MOS transistors.

iii. When bipolar-CMOS mixed process (Bi-CMOS process) is employed, which is frequently employed in semiconductor manufacturing process of ICs for high frequencies, the switches can be implemented either by bipolar transistors or MOS transistors. From the viewpoint of reducing consumption current, use of MOS transistors, which do not require current to constantly flow in order to turn on transistors, is advantageous.

[1-7] Memory

Figures 11, 12:
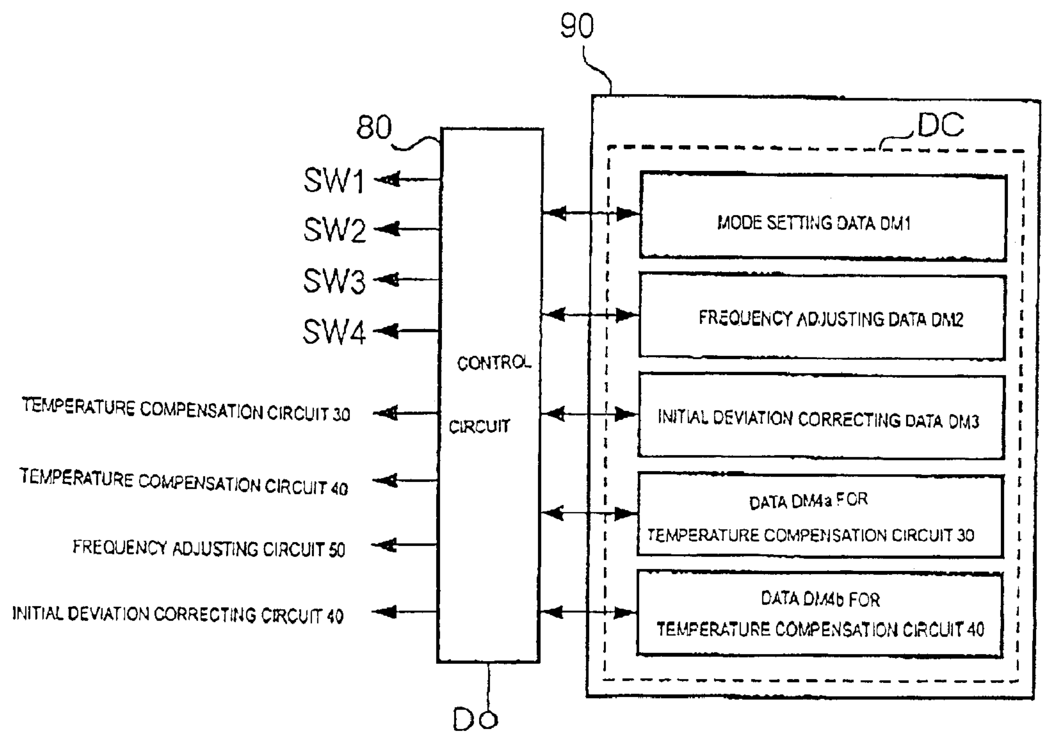
FIG. 11 is a diagram showing a memory together with components in the vicinity thereof.
FIG. 12 is a diagram showing relationship between operation modes and switches.

The memory 90 is implemented by a writable or rewritable memory such as a PROM (Programmable Read Only Memory) or an EPROM (Erasable PROM). As shown in FIG. 11, as control data DC, the memory 90 stores mode setting data DM1, frequency adjusting data DM2, initial deviation correcting data DM3, and data DM4_a_ for the temperature compensation circuit 30 and data DM4_b_ for the temperature compensation circuit 40 in a predetermined area. The initial deviation correcting data DM3 indicates control status of the switches in the third resistor circuit 61 of the initial deviation correcting circuit 60, initial deviation correcting data DM3_b_ indicates control status of switches in a final correction unit 62, and the data DM4_a_ for the temperature compensation circuit 30 and the data DM4_b_ for the temperature compensation circuit 40 are temperature compensation data for the temperature compensation circuits 30 and 40, respectively.

The mode setting data DM1 is used to set an operation mode of the oscillator 10, and it indicates control status of the switches SW1 to SW4. In this embodiment, five operation modes are supported, namely, VC-TCXO mode, TCXO mode, VCXO mode, SPXO mode, and test mode, as shown in FIG. 12, and mode setting data DM1 corresponding to one of the operation modes is stored in the memory 90.

Now, the operation modes of the oscillator 10 will be described. VC-TCXO mode is an operation mode in which the oscillator 10 functions as a VC-TCXO, and the mode is set by turning on all the switches SW1 to SW4.

That is, in VC-TCXO mode, the temperature compensation voltage V1, the temperature compensation voltage V2, the frequency adjusting voltage V3, and the initial deviation correcting voltage V4 are output to the addition circuit 70 so that a sum of these voltages is supplied to the voltage-controlled oscillation circuit 20 as the control voltage VA.

TCXO mode is an operation mode in which the oscillator 10 functions as a TCXO, and the mode is set by turning on the switches SW1, SW2, and SW3 while turning off the switch SW4. That is, in TCXO mode, a sum of the temperature compensation voltage V1, the temperature compensation voltage V2, and the initial deviation correcting voltage V4 is supplied to the voltage-controlled oscillation circuit 20 as the control voltage VA.

VCXO mode is an operation mode in which the oscillator 10 functions as a VCXO, and the mode is set by turning on the switches SW3 and SW4 while turning off the switches SW1 and SW2. That is, in VCXO mode, a sum of the frequency adjusting voltage V3 and the initial deviation correcting voltage V4 is supplied to the voltage-controlled oscillation circuit 20 as the control voltage VA. In VCXO mode, a mode in which temperature compensation of a linear line is added to VCXO mode by turning on the switch SW2 may be added. In that case, since correction of a temperature characteristic of a linear line is allowed, frequency-temperature characteristic is further improved compared with VCXO mode described above. SPXO mode is an operation mode in which the oscillator 10 functions as an SPXO, and the mode is set by turning on the switch SW4 while turning off the switches SW1, SW2, and SW3. That is, in SPXO mode, the initial deviation correcting voltage V4 is supplied to the voltage-controlled oscillation circuit 20 as the control voltage VA.

Test mode is an operation mode that is set when, for example, temperature characteristics of the piezoelectric vibrator 21 is evaluated by the manufacturer, and the mode is set by turning off all the switches SW1 to SW4. This allows an output signal of the crystal oscillator itself, constituted of the piezoelectric vibrator 21 and the oscillation circuit 22, to be output from the output terminal OUT, so that the voltage-controlled oscillation circuit 20 can be evaluated with the piezoelectric vibrator 21 mounted.

As described above, the oscillator 10 according to this embodiment includes the temperature compensation circuits 30 and 40, the frequency adjusting circuit 50, and the initial deviation correcting circuit 60, and the temperature compensation voltage V, the temperature compensation voltage V2, the frequency adjusting voltage V3, and the initial deviation correcting voltage V4 output from these circuits are selectively added based on the mode setting data DM1, supplying a sum to the voltage-controlled oscillation circuit 20 as the control voltage VA. Thus, the oscillator 10 can be used as any of VC-TCXO, TCXO, VCXO, and SPXO. Accordingly, VC-TCXO, TCXO, VCXO, and SPXO can be developed simultaneously, serving to improve efficiency of development compared with before.

Furthermore, the oscillator 10 allows control data DC to be externally supplied via the data input terminals D and to be stored in the memory 90. Thus, operation mode of the oscillator 10, frequency control characteristic in accordance with the control voltage Vc, and amount of initial deviation can be adjusted at any time after manufacturing of the oscillator 10. Accordingly, need for inventory management of oscillators on a type-by-type basis is eliminated, and obviously, separate production lines are not needed, serving to take advantage of mass production even further.

[2] Second Embodiment

Figure 13:
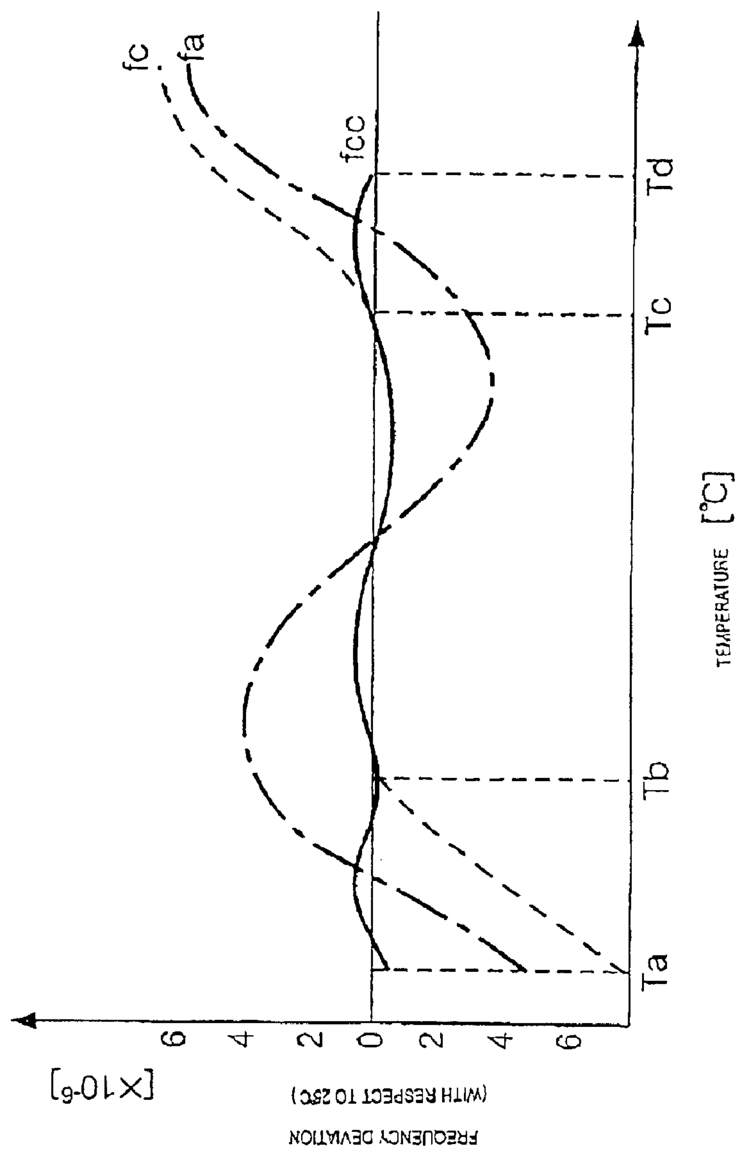
FIG. 13 is a diagram for explaining temperature compensation circuits in an oscillator according to a second embodiment.

An oscillator 10 according to the second embodiment differs from the oscillator 10 according to the first embodiment in that the temperature compensation circuit 30 outputs the temperature compensation voltage V1 only in a temperature range in which the temperature compensation voltage V2 of the temperature compensation circuit 40 does not suffice to keep the oscillation signal Sout within a predetermined range of frequency deviation. More specifically, as shown in FIG. 13, the temperature compensation voltage V1 of the temperature compensation circuit 30 is supplied to the voltage-controlled oscillation circuit 20 via the addition circuit 70 only in temperature ranges of Ta to Tb and Tc to Td in which a frequency-temperature characteristic fc of the oscillation signal Sout that has been temperature-compensated by the temperature compensation circuit 40 is not within an intended range of frequency deviation. Accordingly, a frequency-temperature characteristic fcc in which frequency deviation of the oscillation signal Sout is within the intended range of frequency deviation also at temperature ranges Ta to Tb and Tc to Td is achieved, and furthermore, in the temperature range of Tb to Tc, noise is further reduced since noise component included in the temperature compensation voltage V1 from the temperature compensation circuit 30 is not applied to the control voltage VA.

[3] Third Embodiment

Figure 14:
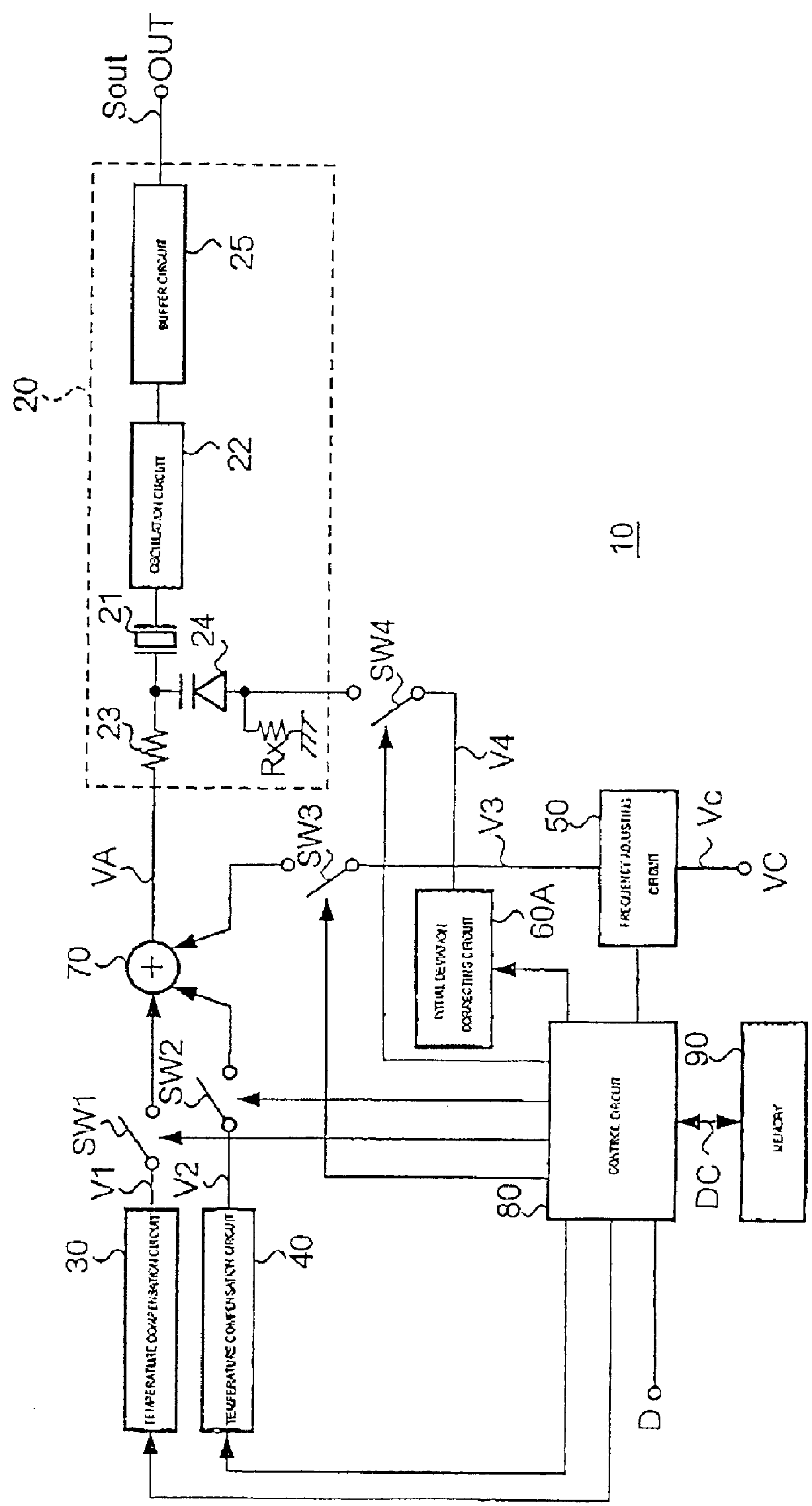
FIG. 14 is a principle construction diagram of an oscillator according to a third embodiment.

FIG. 14 is a principle construction diagram of an oscillator according to a third embodiment.

The oscillator 10 according to the third embodiment significantly differs from the oscillators 10 according to the embodiments described above in that an initial deviation correcting circuit 60A is connected to the anode of the varicap 24 of the voltage-controlled oscillation circuit 20 via the switch SW4. In accordance therewith, a midpoint node between the anode of the varicap 24 and the switch SW4 is grounded via a bias resistor Rx.

Figure 15:
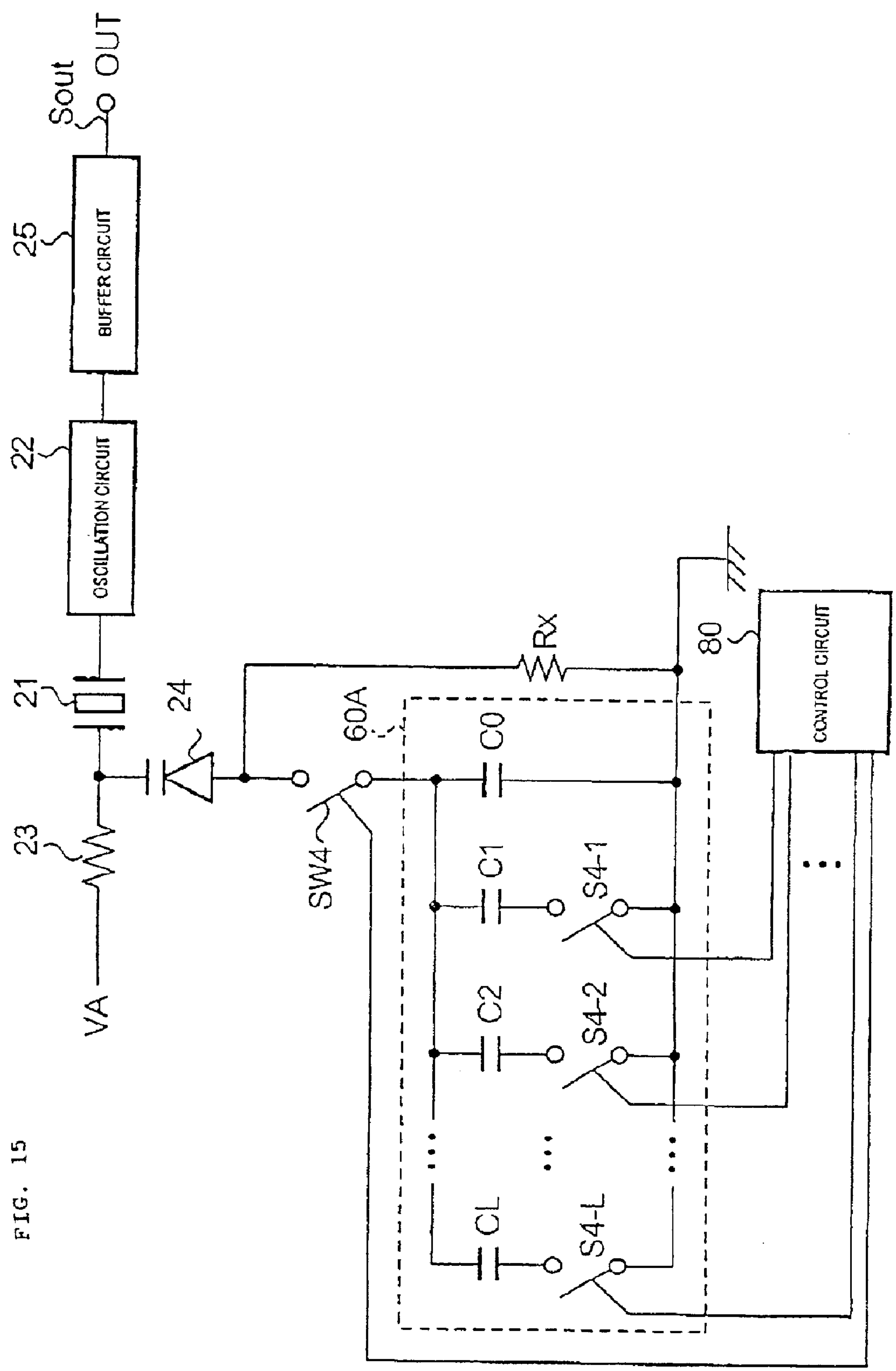
FIG. 15 is a circuit diagram showing an initial deviation correcting circuit together with components in the vicinity thereof in the oscillator according to the third embodiment.

FIG. 15 is a circuit diagram showing the initial deviation correcting circuit 60A together with components in the vicinity thereof.

The initial deviation correcting circuit 60A includes a base capacitor C0 that functions as a fixed-connection capacitor, one end thereof being connected to the switch SW4 and the other end thereof being grounded; L capacitors Cj (j=1 to L) that function as capacitors to be selected for changing the capacitance of the initial deviation correcting circuit 60A; and switches S4-j for connecting selected ones of the capacitors C1 to CL with the base capacitor C0 in parallel. In this case, the capacitances of the capacitors C1 to CL may be all the same or different from one another. When the capacitances are to be varied, setting of capacitance over a wide range is allowed by setting the capacitances of the capacitors C1 to CL to be 2X (X=an integer not smaller than two) times a preset base capacitance.

Accordingly, the switches S4-1 to S4-L of the initial deviation correcting circuit 60A are controlled by the control circuit 80, changing the frequency of the output signal Sout, so that fluctuation in frequency, caused by fluctuation of the piezoelectric vibrator 21, etc., is corrected.

[4] Fourth Embodiment

Figure 16:
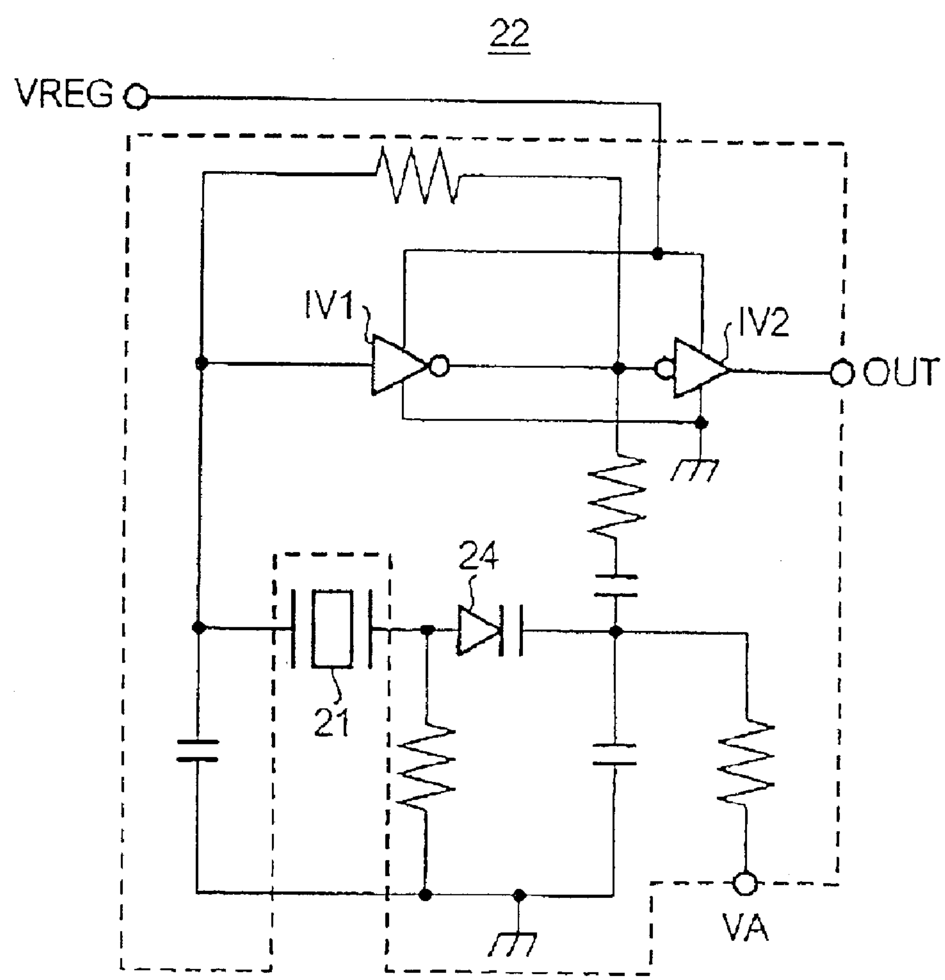
FIG. 16 is a circuit diagram of an oscillation circuit in an oscillator according to a fourth embodiment.

An oscillator 10 according to a fourth embodiment differs from the oscillators 10 according to the embodiments described above in that, as shown in FIG. 16, the oscillation circuit 22 is implemented by a CMOS oscillation circuit including CMOS inverters IV1 and IV2. In FIG. 16, a region surrounded by a wavy line is a portion to be included when components including the oscillation circuit 22 are implemented by a one-chip IC.

[5] Fifth Embodiment

Figure 17:
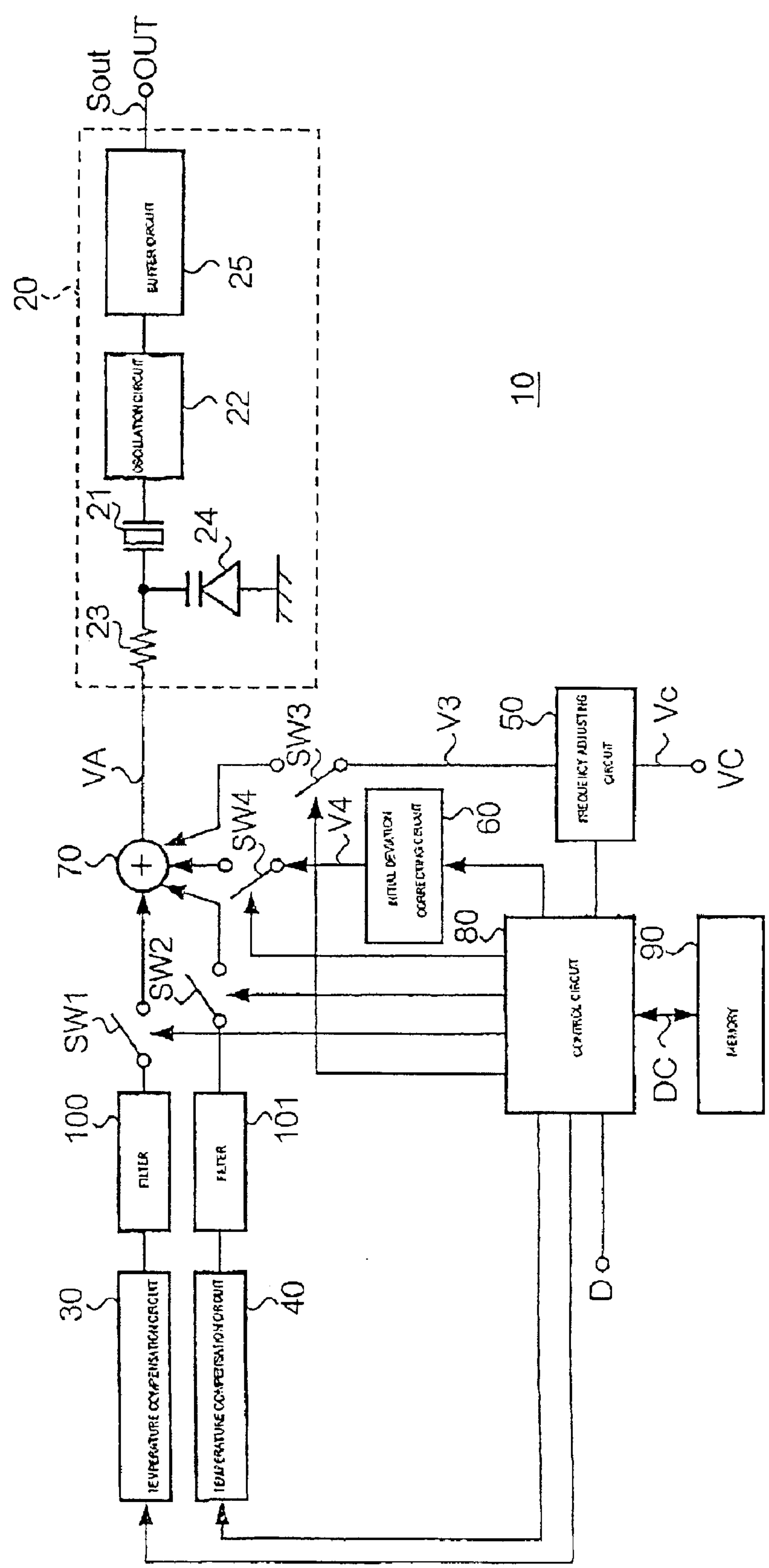
FIG. 17 is a principle construction diagram of an oscillator according to a fifth embodiment.

FIG. 17 is a principle construction diagram of an oscillator according to a fifth embodiment. The oscillator 10 according to the fifth embodiment differs from the oscillators 10 according to the first and second embodiments described earlier in that filters 100 and 101 are provided subsequently to the temperature compensation circuits 30 and 40 so that the temperature compensation voltage V1 and the temperature compensation voltage V2 are cleared of noise before being output to the voltage-controlled oscillation circuit 20 (or to the addition circuit 70). Thus, even if step noise is superposed on the temperature compensation voltages V1 and V2 due to, for example, effect of resolutions of the D/A conversion circuits 34, 42, and 43, in the temperature compensation circuits 30 and 40 (FIGS. 5 and 6), the filters 101 and 100 removes the noise, serving to improve accuracy of temperature compensation. Alternatively, only one filter may be provided subsequently to one of the temperature compensation circuits 30 and 40 with larger noise. Furthermore, filters of this type may be provided subsequently to the temperature compensation circuits 30 and 40 in the oscillators 10 according to the third and fourth embodiments.

[6] Sixth Embodiment

Figure 18:
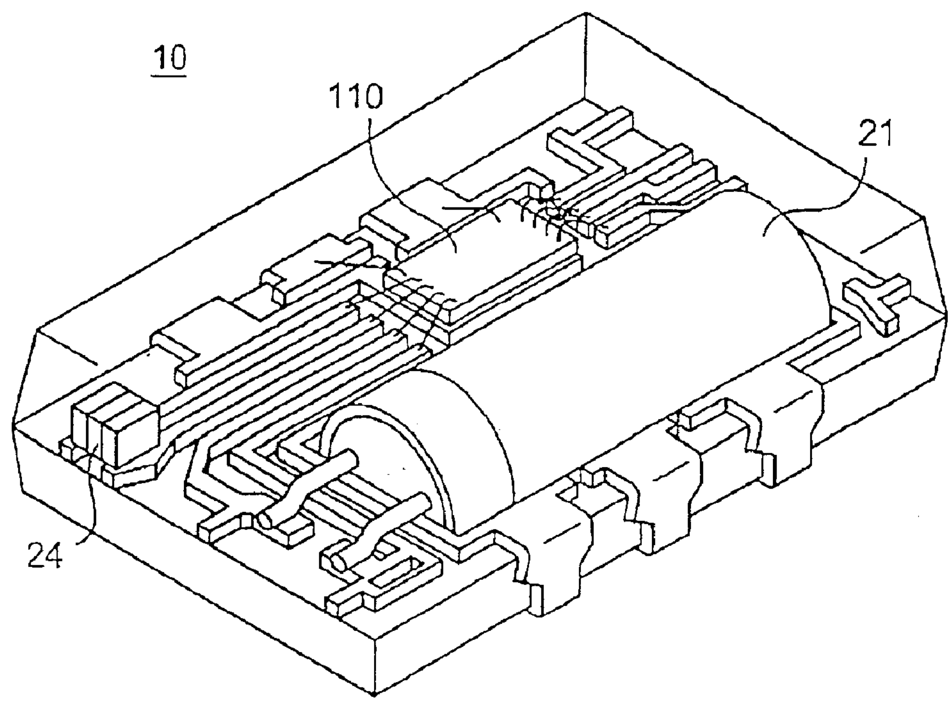
FIG. 18 is a diagram showing an example construction of an oscillator 10 according to a sixth embodiment.

FIG. 18 is a diagram showing an example construction of an oscillator 10 according to a sixth embodiment.

In the above description of the embodiments, mounting state of the components of the oscillators 10 has not been mentioned. In the oscillator 10 according to this embodiment, components except for the piezoelectric vibrator 21 and the DC cutting capacitor Cdc 24 are implemented by a one-chip IC 110, and the one-chip IC 110, the piezoelectric vibrator 21, and the DC cutting capacitor Cdc24 are mold-sealed. Accordingly, the oscillator 10 can be implemented in small size, and the number of components is reduced, serving to further reduce assembly work and manufacturing cost.

[7] Modifications

Figure 19:
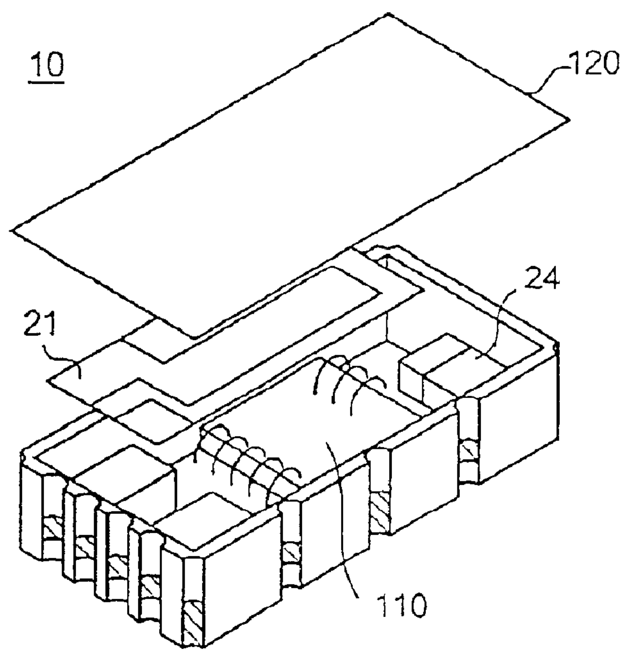
FIG. 19 is a diagram showing an example construction of an oscillator according to a modification.

Although the oscillator 10 is mold-sealed in the sixth embodiment described above, the oscillator 10 may be implemented by a ceramic package in which the one-chip IC 110, the piezoelectric vibrator 21, and the DC cutting capacitor Cdc24 are sealed by a lid 120, as in a modification shown in FIG. 19. Although the one-chip IC 110 is connected to a substrate by wire bonding in FIG. 19, flip-chip bonding (FCB) may be employed instead.

Figure 20:
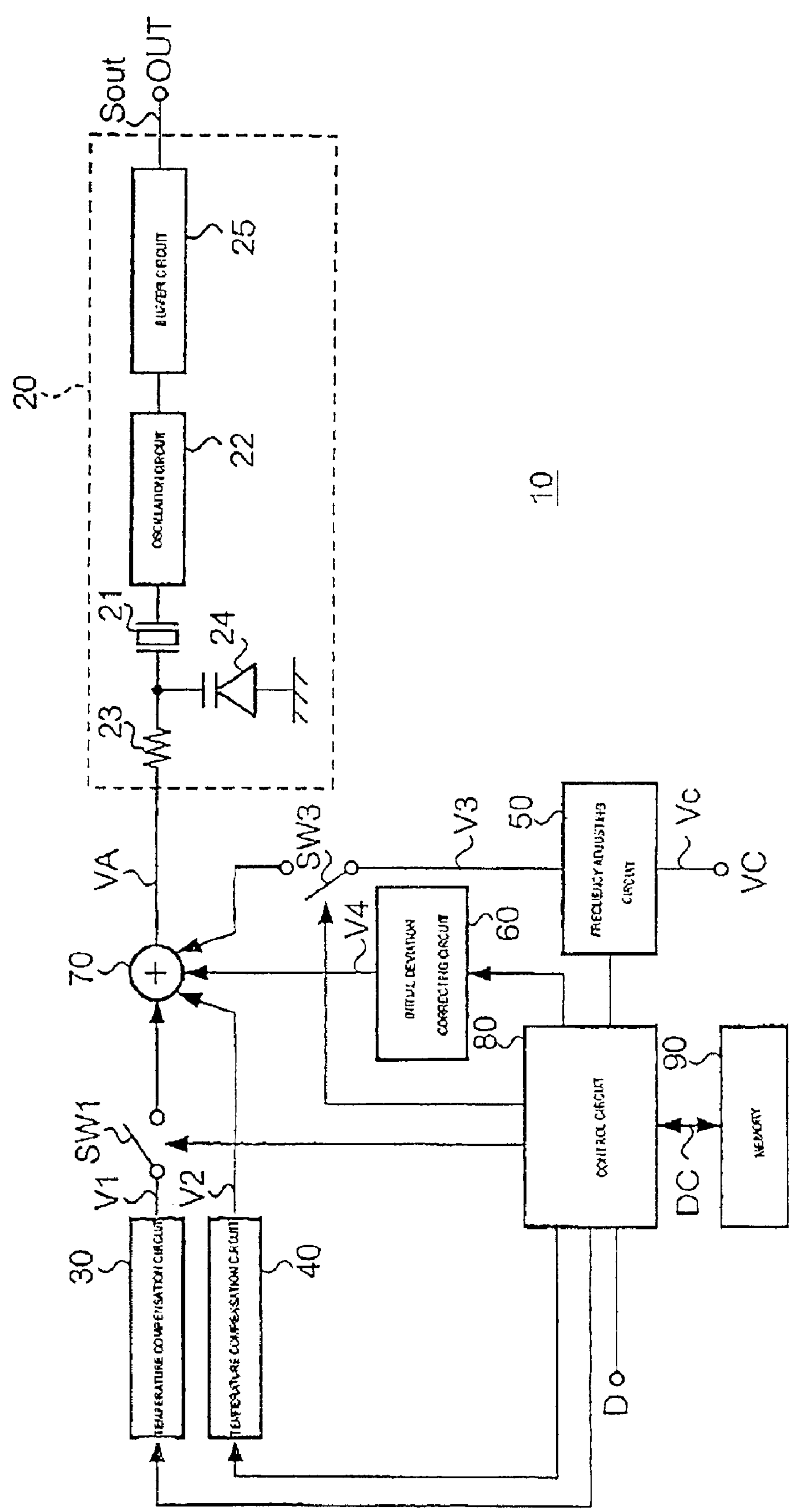
FIG. 20 is a principle construction diagram of an oscillator according to a modification.

Although switching among five operation modes is allowed in the oscillators 10 according to the embodiments described above, it suffices to allow switching at least between two operation modes. For example, if switching is allowed only between TCXO mode and VCXO mode, the temperature compensation circuit 40, which is used in either mode, is always in connected with the addition circuit 70, as shown in FIG. 20. In the figure, also the initial deviation correcting circuit 60 is always in connection with the addition circuit 70.

Figure 21:
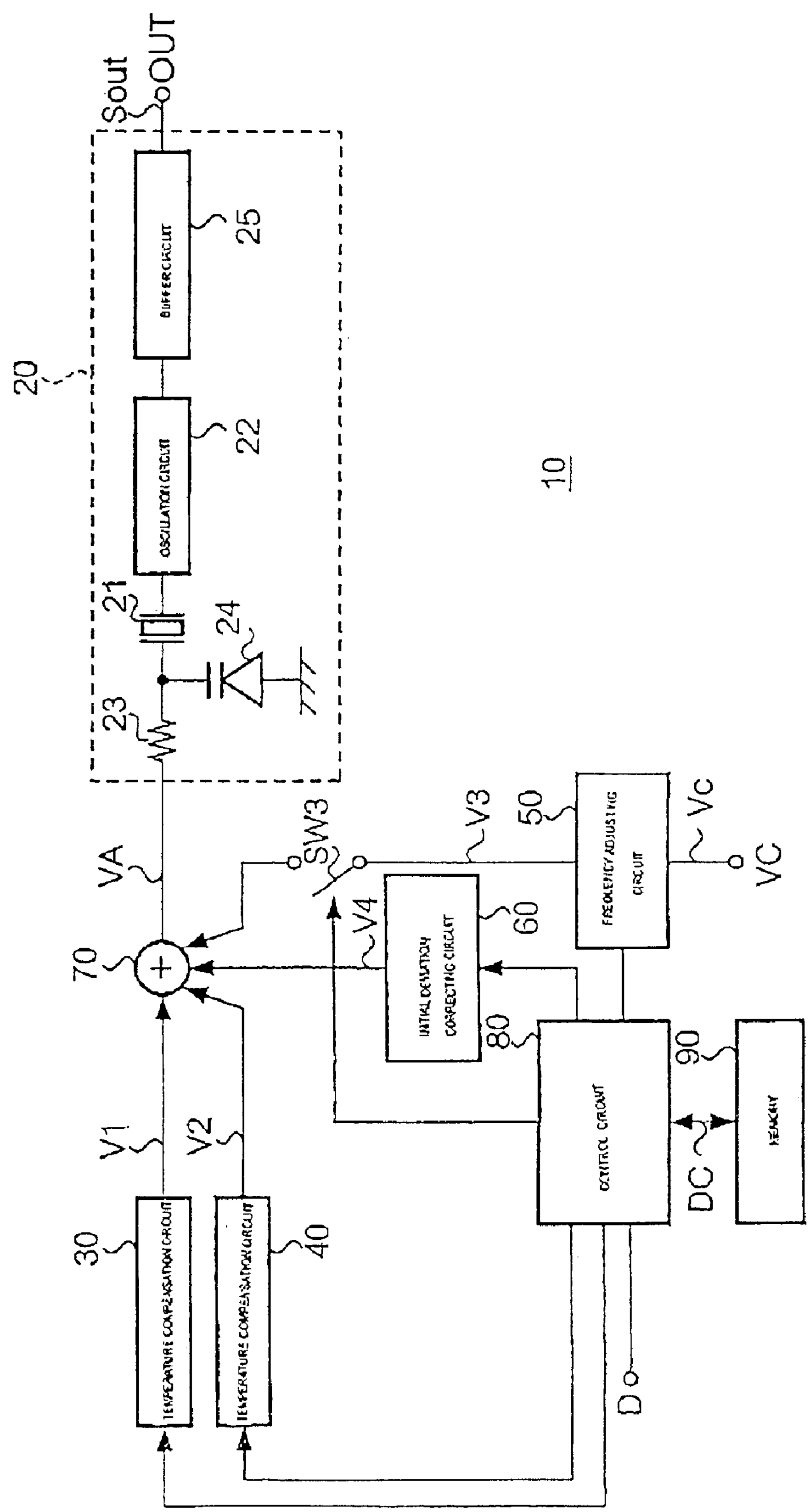
FIG. 21 is a principle construction diagram of an oscillator according to a modification.

Although operation mode of the oscillator 10 is set by the control circuit 80 controlling the switches SW1 to SW4 in the embodiments describe above, the control circuit 80 may directly control whether or not to drive the temperature compensation circuits 30 and 40, as in an example shown in FIG. 21.

Although apparatuses in which the oscillators 10 are to be used have not been particularly mentioned in the above description of the embodiments, the oscillators 10 may be used in wired or wireless communication apparatuses such as cellular phones, PHSs, and pagers, and in various electronic apparatuses such as personal computers, PDAs (Personal Digital Assistants), electronic timepieces, and printers.

What is claimed is:

1. An oscillator comprising:

a voltage-controlled oscillation circuit including a vibrator, frequency of an output signal thereof changing in accordance with a control voltage supplied thereto;

a first temperature compensation circuit for outputting a first temperature compensation voltage for temperature-compensating a frequency-temperature characteristic of the vibrator according to a cubic curve model that approximates a frequency-temperature characteristic of the vibrator;

a second temperature compensation circuit for outputting a second temperature compensation voltage for temperature-compensating a frequency-temperature characteristic of the vibrator according to a linear line model that approximates a frequency-temperature characteristic of the vibrator; and selection means for supplying either a sum voltage of the first temperature compensation voltage and the second temperature compensation voltage or the second temperature compensation voltage to the voltage-controlled oscillation circuit as the control voltage.

2. An oscillator according to claim 1, wherein the selection means comprises:

a switch for selecting whether or not to output the first temperature compensation voltage;

an addition circuit for adding the first temperature compensation voltage supplied via the switch and the second temperature compensation voltage, outputting a sum as the control voltage;

a memory for storing control data for controlling the switch; and a control circuit for storing the control data in the memory based on adjustment control data that is supplied externally and controlling the switch based on the control data stored in the memory.

3. An oscillator according to claim 2, further comprising a frequency adjusting circuit for converting a control voltage that is supplied externally to output a frequency adjusting voltage, wherein the selection means further comprises a third switch for selecting whether or not to output the frequency adjusting voltage, the control circuit further controls the third switch based on the control data stored in the memory, and the addition circuit further adds the frequency adjusting voltage supplied via the third switch, outputting a sum as the control voltage.

4. An oscillator according to claim 2, further comprising an initial deviation correcting circuit for outputting an initial deviation correcting voltage for correcting an initial deviation of the frequency of the output signal, wherein the selection means further comprises a fourth switch for selecting whether or not to output the initial deviation correcting voltage, the control circuit further controls the fourth switch based on the control data stored in the memory, and the addition circuit further adds the initial deviation correcting voltage supplied via the fourth switch, outputting a sum as the control voltage.

5. An oscillator according to claim 1, wherein the selection means comprises:

a memory for storing control data;

an addition circuit for adding the first temperature compensation voltage and the second temperature compensation voltage, outputting a sum as the control voltage; and a control circuit for storing the control data in the memory based an adjustment control data that is supplied externally and controlling operation of the second temperature compensation circuit based on the control data stored in the memory.

6. An oscillator according to claim 1, wherein the first temperature compensation circuit outputs the first temperature compensation voltage only in a preset temperature range, and the temperature range excludes at least a temperature range in which the second temperature compensation voltage suffices to keep frequency deviation of the output signal within a predetermined range of frequency deviation.

7. An oscillator according to claim 1, further comprising:

a first filter for removing noise in the first temperature compensation voltage, provided subsequently to the first temperature compensation circuit; and a second filter for removing noise in the second temperature compensation voltage, provided subsequently to the second temperature compensation circuit.

8. A communication apparatus incorporating an oscillator according to claim 1, the communication apparatus operating based on the output signal of the oscillator.

9. An oscillator comprising:

a voltage-controlled oscillation circuit including a vibrator, frequency of an output signal thereof changing in accordance with a control voltage supplied thereto;

a first temperature compensation circuit for outputting a first temperature compensation voltage for temperature-compensating a frequency-temperature characteristic of the vibrator according to a cubic curve model that approximates a frequency-temperature characteristic of the vibrator;

a second temperature compensation circuit for outputting a second temperature compensation voltage for temperature-compensating a frequency-temperature characteristic of the vibrator according to a linear line model that approximates a frequency-temperature characteristic of the vibrator; and selection means for supplying one of a sum voltage of the first temperature compensation voltage and the second temperature compensation voltage, the first temperature compensation voltage, and the second temperature compensation voltage to the voltage-controlled oscillation circuit as the control voltage.

10. An oscillator according to claim 9, wherein the selection means comprises:

a first switch for selecting whether or not to output the first temperature compensation voltage;

a second switch for selecting whether or not to output the second temperature compensation voltage;

an addition circuit for adding the first temperature compensation voltage supplied via the first switch and the second temperature compensation voltage supplied via the second switch, outputting a sum as the control voltage;

a memory for storing control data for controlling the first and second switches; and a control circuit for storing the control data in the memory based on adjustment control data that is supplied externally and controlling the first and second switches based on the control data stored in the memory.

11. An oscillator according to claim 9, wherein the selection means comprises:

a memory for storing control data;

an addition circuit for adding the first temperature compensation voltage and the second temperature compensation voltage, outputting a sum as the control voltage; and a control circuit for storing the control data in the memory based on adjustment control data that is supplied externally and controlling operation of the first and second temperature compensation circuits based on the control data stored in the memory.

* * * * *